United States Patent [19]

Kawase

[11] Patent Number: 5,584,929
[45] Date of Patent: Dec. 17, 1996

[54] METHOD FOR PREPARING COMPOUND SEMICONDUCTOR CRYSTAL

[75] Inventor: Tomohiro Kawase, Hyogo, Japan

[73] Assignee: Sumitomo Electric Industries, Ltd., Osaka, Japan

[21] Appl. No.: 400,925

[22] Filed: Mar. 9, 1995

[30] Foreign Application Priority Data

Mar. 11, 1994 [JP] Japan ................... 6-040724

[51] Int. Cl.⁶ .................................... C30B 11/04
[52] U.S. Cl. .................. 117/11; 127/54; 127/900
[58] Field of Search ................... 117/11, 54, 64, 117/80, 81, 82, 83, 900; 204/192.1; 252/62.3 GA; 427/429, 430.1

[56] References Cited

U.S. PATENT DOCUMENTS

| | | | |
|---|---|---|---|
| 3,734,817 | 5/1973 | Bienert et al. | 118/500 |
| 3,928,096 | 12/1975 | Vergano et al. | 148/189 |
| 4,923,561 | 5/1990 | Chemans et al. | 117/83 |
| 4,999,082 | 3/1991 | Kremer et al. | 252/62.3 GA |
| 5,131,975 | 7/1992 | Bournet-Courchesne | 117/82 |

FOREIGN PATENT DOCUMENTS

| | | |
|---|---|---|
| 0104741 | 4/1984 | European Pat. Off. |
| 0222404 | 5/1987 | European Pat. Off. |
| 0417843 | 3/1991 | European Pat. Off. |
| 49-42419 | 11/1974 | Japan. |
| 0191094 | 9/1985 | Japan. |
| 62-176998 | 8/1987 | Japan. |
| 1290589 | 11/1989 | Japan. |
| 2-44798 | 10/1990 | Japan. |
| 3-122097 | 5/1991 | Japan. |
| 4063234 | 2/1992 | Japan. |
| 6239686 | 8/1994 | Japan. |

OTHER PUBLICATIONS

G. Ajithkumar et al., "A Crystal Growth System with modified pulling arrangement and temperature controller", 8056 Measurement Sci. & Tech. 5 (1994) Aug., No. 8, pp. 1018–1020.

Primary Examiner—R. Bruce Breneman
Assistant Examiner—Felisa Garrett
Attorney, Agent, or Firm—W. G. Fasse; W. F. Fasse

[57] ABSTRACT

A method of preparing a compound semiconductor crystal in a crucible involves first forming a boron or boron compound containing layer on an inner surface of the crucible and heat treating the same to form a $B_2O_3$ containing layer. The resulting pretreated crucible is the employed for preparing the compound semiconductor crystal. By pretreating the crucible in this manner, it is possible to previously form a homogenous $B_2O_3$ film on the crucible interior surface while preventing incomplete and heterogeneous coating of the $B_2O_3$ film. Consequently, it is possible to prevent a raw material melt from wetting the crucible interior surface and thus to suppress polycrystallization, thereby preparing a compound semiconductor single crystal with an excellent yield.

45 Claims, 5 Drawing Sheets

METHOD FOR PREPARING COMPOUND SEMICONDUCTOR CRYSTAL

BACKGROUND OF THE INVENTION

1. Field of the Invention

The present invention relates to a method of and a crucible for preparing a compound semiconductor crystal, and more particularly, it relates to a method of and an apparatus for preparing a compound semiconductor crystal such as a group III–V compound semiconductor crystal of GaAs, GaP, GaSb, InP, InAs or InSb, or a group II–VI compound semiconductor crystal of CdTe, CdMnTe, CdZnTe, HgCdTe, ZnSe or ZnSSe.

2. Description of the Background Art

Typical conventional methods of preparing compound semiconductor bulk crystals are a horizontal Bridgman method, a gradient freezing method, a vertical Bridgman method, and a vertical gradient freezing method. In order to grow a single crystal by any of these methods, a seed crystal is first arranged on an end of a boat or a crucible and brought into contact with a raw material melt, and the temperature is gradually reduced from the seed crystal side to grow a single crystal. In such a method, however, the crystal is grown while being in contact with the container wall, and hence crystal defects are disadvantageously caused due to wetting of the melt and the container wall.

It has generally been known in the art that crystal defects are caused in wet portions of the melt and the container wall, to result in polycrystallization. In order to solve this problem, the following countermeasure has been considered in general:

A boat or a crucible is generally made of quartz or PBN (pyrolytic boron nitride). In relation to a boat or a crucible of quartz, it is known possible to reduce its wettability by roughening its surface by sandblasting. In relation to a crucible of PBN, on the other hand, it is known possible to prevent wetting by covering its inner surface with boron oxide ($B_2O_3$) which is introduced therein with the raw material, for example.

FIG. 5 is a sectional view showing an exemplary apparatus for preparing a GaAs single crystal by the vertical Bridgman method.

Referring to FIG. 5, this apparatus comprises a stainless chamber 1, a heat insulator 2 which is arranged along its wall surface, heaters 3 to 12 which are arranged in its interior, and a quartz ampoule 14, supported by a lower shaft 13, which is mounted on its center. An arsenic pressure control part 15 is provided on a lower end of the ampoule 14 for controlling the temperature of this portion, thereby controlling the arsenic partial pressure in the ampoule 14. The arsenic partial pressure is controlled with solid arsenic 16.

In the apparatus having the aforementioned structure, a GaAs crystal is prepared in the following manner:

First, a crucible 17 is arranged in an upper portion of the ampoule 14. The lower portion of the crucible 17 is in the form of an inverted cone, so that a seed crystal 18 is mounted on its lower end. Then, GaAs raw material 19 and $B_2O_3$ are charged on the seed crystal 18 which is arranged in the crucible 17. Thereafter the ampoule 14 is sealed, and heated by the heaters 3 to 12. In this heating, the $B_2O_3$ is first softened to cover the inner surface of the crucible 17. Thereafter the temperature is further increased to melt the GaAs raw material 19, and temperature distribution is optimized, so that the lower shaft 13 is thereafter downwardly moved to move the ampoule 14 toward a lower temperature side, and the raw material 19 is solidified from the seed crystal 18 side, thereby growing a single crystal.

The vertical gradient freezing method is carried out substantially similarly to the vertical Bridgman method shown in FIG. 5, except that the vertical position of the ampoule 14 is left intact and outputs of the heaters 3 to 12 are varied to gradually upwardly move the lower temperature portion so that the raw material 19 which is stored in the ampoule 14 is solidified from the seed crystal 18 side for growing a single crystal.

When the vertical Bridgman method or the vertical gradient freezing method is employed, it is possible to alternatively grow a crystal in the atmosphere, without employing the stainless chamber 1. In this case, the heat insulator 2, the heaters 3 to 12 and the like must be formed to be employable in the atmosphere.

In the aforementioned conventional method, however, it is not necessarily possible to completely cover the inner surface of the crucible with $B_2O_3$, although the raw material and $B_2O_3$ are introduced into the crucible together and the ampoule is sealed so that $B_2O_3$ is softened to cover the inner surface of the crucible. To this end, Japanese Patent Laying-Open No. 62-176998 (1987) proposes a method of previously spreading boron oxide powder or boric acid powder on an inner surface of a PBN boat. Further, each of Japanese Patent Laying-Open No. 62-176998 and U.S. Pat. No. 4923561 proposes method of previously heating a PBN boat or a BN crucible in an oxygen atmosphere and oxidizing the same thereby previously forming a $B_2O_3$ coat on the inner surface of the boat or the crucible, and thereafter introducing raw material into the same for growing a crystal. According to this method, the inner surface of the boat or the crucible is previously covered with $B_2O_3$, and hence it is conceivably possible to attain a higher effect of preventing polycrystallization caused by wetting, as compared with the conventional method of charging $B_2O_3$ with the raw material.

However, the aforementioned methods have the following problems respectively:

First, the method of previously spreading boron oxide powder or boric acid powder on the inner surface of a PBN boat or crucible has the following problems:

First, it is scarcely possible to attain adhesion of the boron oxide powder or the boric acid powder to the inner surface of the crucible by simply spreading the same. Therefore, the powder is disadvantageously easily separated from the crucible surface through contact with the raw material as introduced. Consequently, it is extremely difficult to homogeneously form a $B_2O_3$ film.

Second, the boron oxide powder or the boric acid powder has a high water content, and water-containing $B_2O_3$ is extremely easy to scatter. Therefore, this $B_2O_3$ is scattered before melting of the raw material, to break the film and expose the inner surface of the crucible. Consequently, it is extremely difficult to obtain a homogeneous film since $B_2O_3$ is remarkably scattered particularly under a vacuum.

On the other hand, the method of previously heating a PBN boat or a BN crucible in an oxygen atmosphere and oxidizing the same for previously forming a $B_2O_3$ coat on the inner surface of the boat or the crucible has the following problems:

First, it is generally necessary to form a thick $B_2O_3$ film of about 50 μm, in order to effectively prevent polycrystallization caused by wetting. Due to the formation of such a thick $B_2O_3$ film, therefore, the thickness of the crucible is remarkably reduced and hence its life is extremely reduced.

Second, it is necessary to heat the inner surface of a crucible which is made of PBN (pyrolytic boron nitride) having a dense structure for a long time in order to oxidize the same, and hence the preparation cost is inevitably increased.

Third, it is difficult to maintain a homogeneous flow of oxygen gas although the thickness of the $B_2O_3$ depends on this flow, and $B_2O_3$ is reduced in viscosity due to the high temperature heating and collected in the lower portion of the crucible. Thus, it is extremely difficult to form a homogeneous $B_2O_3$ film.

SUMMARY OF THE INVENTION

An object of the present invention is to provide a method of and a crucible for preparing a crystal, which can solve the aforementioned problems by completely preventing wetting of a raw material melt with respect to a crucible and suppressing polycrystallization, for preparing a compound semiconductor single crystal in an excellent yield.

According to an aspect of the present invention, a method of preparing a compound semiconductor crystal is provided. This method comprises the steps of previously forming a boron or oxygen-free boron compound containing layer on an inner surface of a crucible, heat treating the crucible which is provided with the boron or boron compound containing layer under an oxygen gas or oxygen mixed gas atmosphere thereby forming a boron oxide containing layer at least on a surface of the boron or boron compound containing layer, charging raw material in the crucible which is provided with the boron oxide containing layer, melting the charged raw material for forming a melt, and solidifying the melt from an end of the crucible thereby growing a crystal.

The oxygen-free boron compound is preferably prepared from boron nitride, for example.

In the oxygen mixed gas, gas to be mixed with oxygen is preferably prepared from that hardly reacting with oxygen and having small solubility with respect to $B_2O_3$, which is inactive with respect to the grown crystal. In more concrete terms, the oxygen mixed gas is preferably a mixed gas consisting of nitrogen gas or argon gas and oxygen gas, or air. A mixed gas consisting of helium gas, neon gas, krypton gas, xenon gas or carbon dioxide gas and oxygen gas can be employed.

Further, the heat treatment is carried out at a temperature in the range of 700° C. to 1800° C., preferably in the range of 800° C. to 1500° C., more preferably in the range of 900° C. to 1300° C.

Sputtering or vacuum deposition can be employed as a method of forming a boron nitride containing layer on the inner surface of the crucible. More preferably, a mixture of boron nitride powder and a solvent such as water, alcohol or acetone may be sprayed with gas such as butane gas, nitrogen gas, carbon dioxide gas or air, to form the boron nitride containing layer.

More preferably, a mixture of boron nitride powder and a solvent such as water, alcohol or acetone may be sprayed by hand or through an automatic atomizer, or brushed, to form the boron nitride containing layer.

More preferably, a mixed solution of boron nitride powder and a solvent such as water, alcohol or acetone may be charged in the crucible so that the residual mixed solution is discharged, thereby forming the boron nitride containing layer on the inner surface of the crucible.

When the boron or boron compound containing layer is heat treated under the oxygen gas or oxygen mixed gas atmosphere, the crucible may be screened with a shielding material except the region provided with the boron oxide containing layer. This is because the crystal as grown strongly adheres to the crucible by boron oxide ($B_2O_3$) and cannot be detached from the same and hence the amount of the boron oxide as formed is preferably minimized. In other words, it is preferable to minimize the area of the $B_2O_3$ layer which is formed on the inner surface of the crucible, while it is most preferable to form the boron oxide containing layer limitedly to the portion of the inner surface of the crucible for growing the crystal.

According to another aspect of the present invention, a method of preparing a compound semiconductor crystal is provided. This method comprises the steps of previously forming an oxygen-containing boron compound containing layer on an inner surface of a crucible, heat treating the crucible which is provided with the boron compound containing layer thereby forming a boron oxide containing layer at least on a surface of the boron compound containing layer, charging raw material in the crucible which is provided with the boron oxide containing layer, melting the charged raw material for forming a melt, and solidifying the melt from an end of the crucible thereby growing a crystal.

The oxygen-containing boron compound is preferably prepared from orthoboric acid ($H_3BO_3$), metaboric acid ($HBO_2$), tetraboric acid ($H_2B_4O_7$) or boron oxide ($B_2O_3$), for example. When such an oxygen-containing boron compound is employed, it is not necessary to add oxygen to the atmosphere gas for the heat treatment.

The heat treatment is carried out at a temperature in the range of 300° C. to 1800° C., preferably in the range of 350° C. to 1500° C., and more preferably in the range of 400° C. to 1300° C.

After the boron oxide containing layer is formed by the heat treatment, an additional step may be carried out to again increase the temperature to a level in the range of 1000° C. to 1800° C., for adjusting the water content of boron oxide to not more than 0.5 percent by weight.

In order to form the oxygen-containing boron compound containing layer on the inner surface of the crucible, employed is a method of dissolving or mixing the oxygen-containing boron compound in or with a solvent such as water, alcohol such as methyl alcohol, ethyl alcohol, propyl alcohol or butyl alcohol, or acetone, and applying or spraying the solution as formed onto the inner surface of the crucible.

Alternatively, a solution or a mixed solution of the oxygen-containing boron compound may be charged in the crucible so that the solution or the mixed solution is thereafter discharged, thereby forming the oxygen-containing boron compound containing layer on the inner surface of the crucible.

Further, a solid source of the oxygen-containing boron compound may be sputtered with argon or the like, or irradiated with an electron beam, so that the oxygen-containing boron compound containing layer is formed on the inner surface of the crucible.

In addition, powder of the oxygen-containing boron compound may be charged in the crucible so that the residual powder is removed after the heat treatment, thereby forming the oxygen-containing boron compound containing layer on the inner surface of the crucible.

According to the present invention, the boron oxide concentration in the boron oxide containing layer which is formed on the inner surface of the crucible by the heat treatment may be not less than 30 percent by weight, preferably not less than 40 percent by weight, and more preferably not less than 50 percent by weight, in order to effectively prevent wetting of the crystal and the crucible.

According to the present invention, on the other hand, the boron oxide concentration is preferably minimized in a portion, which is in contact with the crucible, of the boron oxide containing layer formed by the heat treatment. This is because boron oxide ($B_2O_3$) is solidified after the crystal growth, to damage the inner surface of the crucible by strongly adhering thereto. For example, the life of a PBN crucible is reduced since its surface layer is disadvantageously delaminated. When the boron oxide concentration is reduced in the portion which is in contact with the crucible, therefore, it is possible to reduce the damage on the crucible and to increase its life. In more concrete terms, the boron oxide concentration in the portion which is in contact with the crucible may be not more than 70 percent by weight, preferably not more than 60 percent by weight, and more preferably not more than 50 percent by weight, so that it is possible to reduce damage of the crucible caused by strong adhesion of boron oxide.

According to the present invention, as hereinabove described, the boron oxide concentration is reduced in the portion which is in contact with the crucible in the boron oxide containing layer formed by the heat treatment as compared with that on the surface, so that it is possible to effectively prevent wetting of the crystal and the crucible and to reduce damage of the crucible caused by strong adhesion of boron oxide.

According to the inventive method, it is possible to freely adjust the compounding ratio of $B_2O_3$ by adjusting the degree of oxidization and the content of the boron compound.

While it is also possible to adjust the $B_2O_3$ concentration by controlling the temperature and the time for oxidization, a layer having higher density than the surface may be introduced into the boron or boron compound containing layer which is formed on the inner surface of the crucible. This is because oxidization hardly progresses inwardly beyond the layer having high density, and hence it is possible to readily reduce the boron oxide concentration in the portion which is in contact with the crucible as compared with that on the surface.

As to a method of adjusting the boron oxide concentration, it is also effective to further mix at least one substance which is selected from the group consisting of a group III element, a group IV element, a group V element, a compound of the group III element, a compound of the group IV element and a compound of the group V element to the boron or boron compound containing layer.

The group III element is preferably prepared from Al, for example, while the compound of the group III element is preferably prepared from an Al compound, i.e., an Al oxide or an Al nitride in more concrete terms, for example.

Further, the group III element is also preferably prepared from Ga, and the compound of the group III element is also preferably prepared from a Ga compound, i.e., a Ga oxide or a Ga nitride in more concrete terms, for example.

The group IV element is preferably prepared from Si, for example, while the compound of the group IV element is preferably prepared from a Si compound, i.e., a silicon oxide, silicon nitride or silicon carbide in more concrete terms, for example.

Further, it is possible to effectively form the boron oxide containing layer on the surface by reducing concentration of Al or the Al compound, Ga or the Ga compound and Si or the Si compound on the surface of the boron or boron compound containing layer which is formed on the inner surface of the crucible as compared with the interior of the layer and increasing the content of boron or the boron compound on the surface.

According to the present invention, the boron oxide containing layer is preferably be formed only on a portion which is in contact with the raw material melt.

After the boron oxide containing layer is formed on the inner surface of the crucible, the crucible is cooled to the room temperature in a pressure reduction or dry gas atmosphere.

According to the present invention, further, the crucible is preferably cooled to the room temperature in the pressure reduction or dry gas atmosphere, so that the water concentration of the boron oxide containing layer as formed is not more than 0.5 percent by weight, preferably in the range of 0.001 to 0.1 percent by weight, and more preferably in the range of 0.001 to 0.02 percent by weight. This is because boron oxide is scattered with water under a high temperature to damage homogeneity of the film, if the water concentration of the boron oxide containing layer exceeds 0.5 percent by weight. In particular, a thin film of $B_2O_3$ readily absorbs water due to its large specific surface area. After formation of the $B_2O_3$ containing layer, therefore, it is preferable to prevent the $B_2O_3$ containing layer from water absorption by cooling the crucible to the room temperature under the reduced pressure or dry gas atmosphere.

According to the present invention, it is necessary to carry out the heat treatment at a high temperature in order to obtain a $B_2O_3$ film having low water concentration, while the thickness of the $B_2O_3$ film is readily heterogenized as the temperature is increased since $B_2O_3$ flows down toward the lower portion of the crucible due to reduction of its viscosity. Therefore, it is preferable to carry out the process of forming the $B_2O_3$ film by heat treating boron or the boron compound at a relatively low temperature of not more than 1000° C. over a considerably long time, while adjusting the water concentration of the film at a high temperature of not less than 1000° C. in a short time. Due to such heat treatment, it is possible to form a homogeneous $B_2O_3$ film.

The inventive method is applicable to any method such as the horizontal Bridgman method, the vertical Bridgman method, the horizontal gradient freezing method and the vertical gradient freezing method, so far as the method is adapted to prepare a compound semiconductor crystal by solidifying the melt from an end of the crucible. Further, the shape of the crucible as employed is not limited either and any shape is employable so far as the crucible or a boat is applied to the aforementioned method of preparing a compound semiconductor crystal. Further, heating means for carrying out the heat treatment is not restricted to an annular furnace but any means is employable so far as the same can heat the crucible to a target temperature.

According to still another aspect of the present invention, a crucible for preparing a compound semiconductor crystal is provided. This crucible is adapted to prepare a compound semiconductor crystal by melt solidification, and is characterized in that the same is provided on its inner surface with a boron oxide containing layer having water concentration of not more than 0.5 percent by weight, preferably in the range of 0.001 percent by weight to 0.1 percent by weight, more preferably in the range of 0.001 percent by weight to 0.02 percent by weight.

The material for the crucible can be prepared from boron nitride, graphite, pyrolytic boron nitride (PBN), pyrolytic graphite (PG), glassy carbon, alumina, zirconia, silicon nitride, silicon carbide or quartz, for example.

As hereinabove described, the present invention is adapted to prepare a compound semiconductor crystal not by spreading boron oxide powder or boric acid powder onto an inner surface of a crucible or oxidizing a PBN boat or a BN crucible itself but by forming a boron or boron compound containing layer on an inner surface of a crucible and heat treating the same thereby forming a $B_2O_3$ layer. Dissimilarly to the conventional method of growing a crystal by introducing raw material and solid $B_2O_3$ into a crucible, therefore, it is possible to previously form a homogeneous $B_2O_3$ film on the inner surface of the crucible while preventing the $B_2O_3$ film from incomplete or heterogeneous coating. Thus, it is possible to prevent the raw material melt from wetting with the container and to remove the possibility for polycrystallization.

When a boron or oxygen-free boron compound containing layer is formed in the present invention, it is possible to form a $B_2O_3$ containing film on the inner surface of the crucible by heating the same in oxygen-containing gas. For example, a $B_2O_3$ film is formed by oxidizing boron nitride, along a chemical reaction in the following formula (A):

$$4BN+3O_2 \rightarrow 2B_2O_3+2N_2 \tag{A}$$

When an oxygen-containing boron compound containing layer is formed in the present invention, further, oxygen is not inevitably necessary but a $B_2O_3$ film can be formed on the inner surface of the crucible also by thermal decomposition. For example, a $B_2O_3$ film is formed by thermal decomposition of orthoboric acid ($H_3BO_3$), along a chemical reaction in the following formula (B):

$$2H_3BO_3 \rightarrow B_2O_3+3H_2O \tag{B}$$

On the other hand, it is impossible to attain adhesion to the crucible by merely applying boron compound containing powder which is mixed with a solvent. In this case, the film of the powder as applied is disadvantageously stripped when the raw material is stored in the crucible. According to the present invention, therefore, $B_2O_3$ which is formed by the reaction of the formula (A) or (B) is softened at a temperature of not less than 300° C. by the heat treatment, so that particles thereof adhere to the crucible wall. Consequently, it is possible to obtain a $B_2O_3$ film having high adhesion, which is not stripped when the raw material is stored in the crucible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
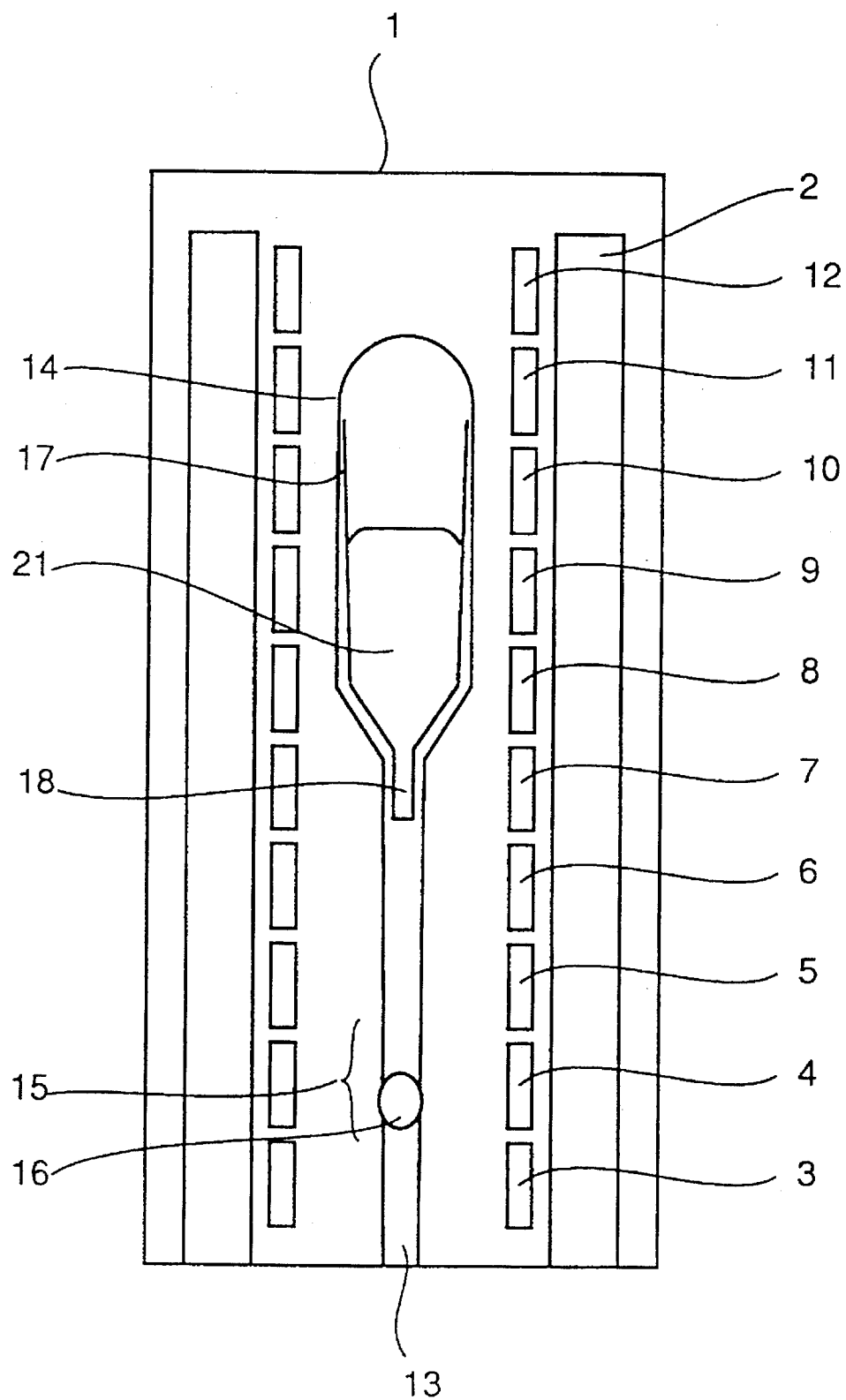
FIG. 1 is a conceptual diagram of an apparatus for preparing a crystal, which is employed for carrying out the inventive method.
Figure 5:
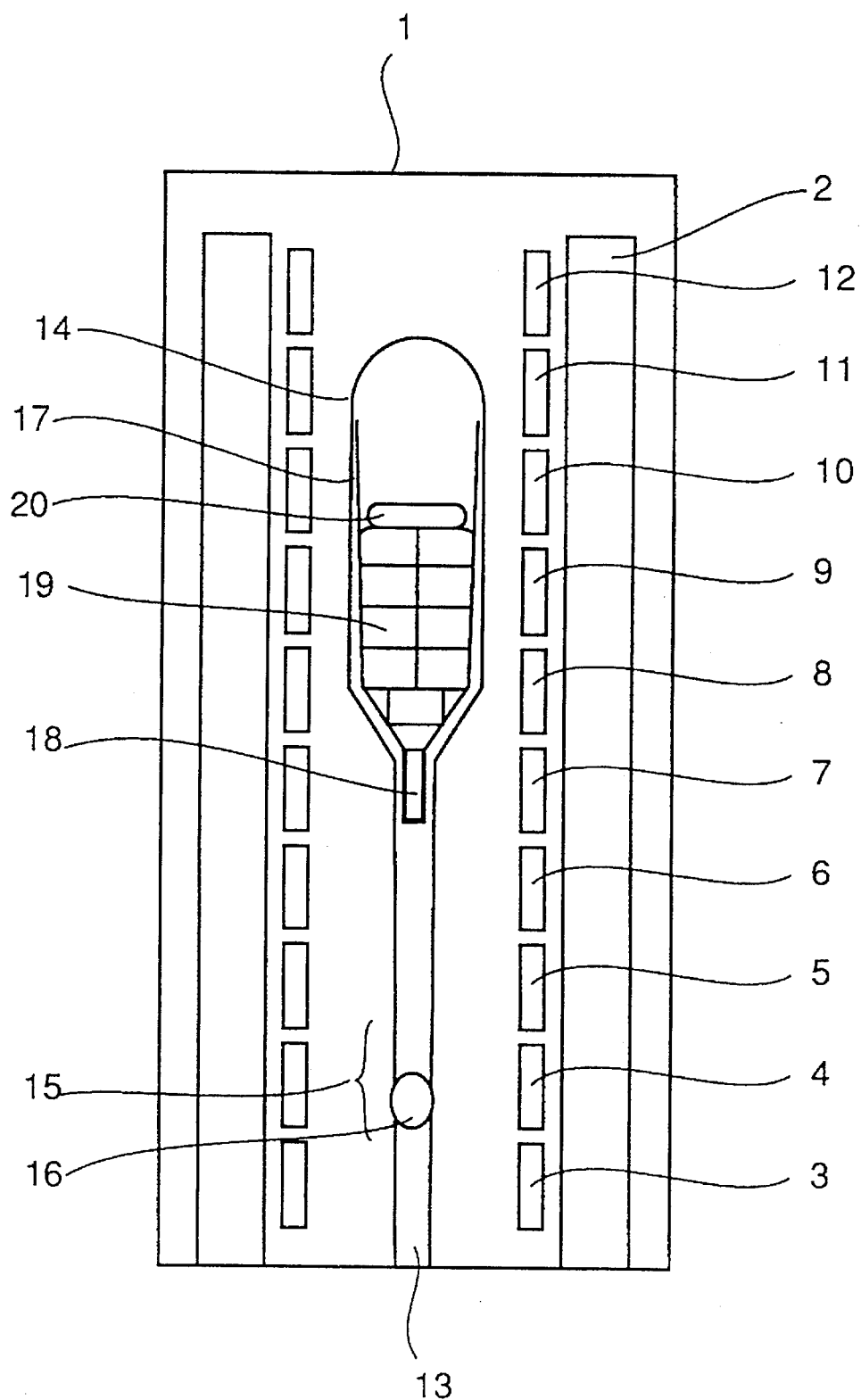
FIG. 5 is a conceptual diagram of a conventional apparatus for preparing a crystal.

FIG. 1 is a conceptual diagram of an apparatus for preparing a crystal, which is employed for carrying out the method according to the present invention. This apparatus is similar to the conventional apparatus shown in FIG. 5 except employment of a crucible which is provided with a $B_2O_3$ containing layer according to the inventive method, and hence redundant description is omitted. In contrast to the apparatus shown in FIG. 5, the apparatus of FIG. 1 is not charged with a crystal forming raw material 19 and $B_2O_3$ material 20, but rather only with a raw material that forms a raw material melt that ultimately forms the single crystal 21. The $B_2O_3$ charging material 20 is omitted due to the special preparation of the crucible 17, as described next.

Figure 2:
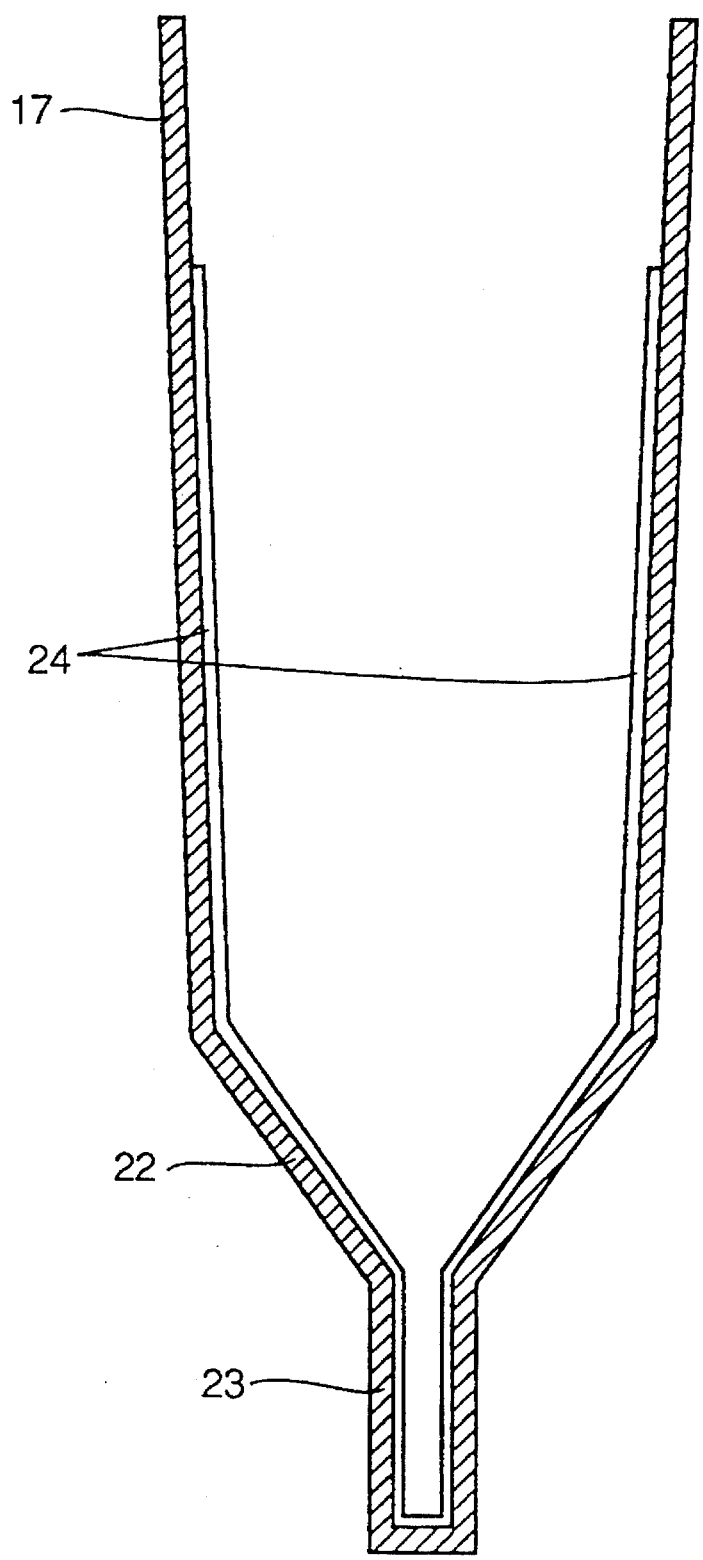
FIG. 2 is an enlarged view showing a crucible employed in FIG. 1, which is provided on its inner surface with a boron or boron compound containing film.
Figure 3:
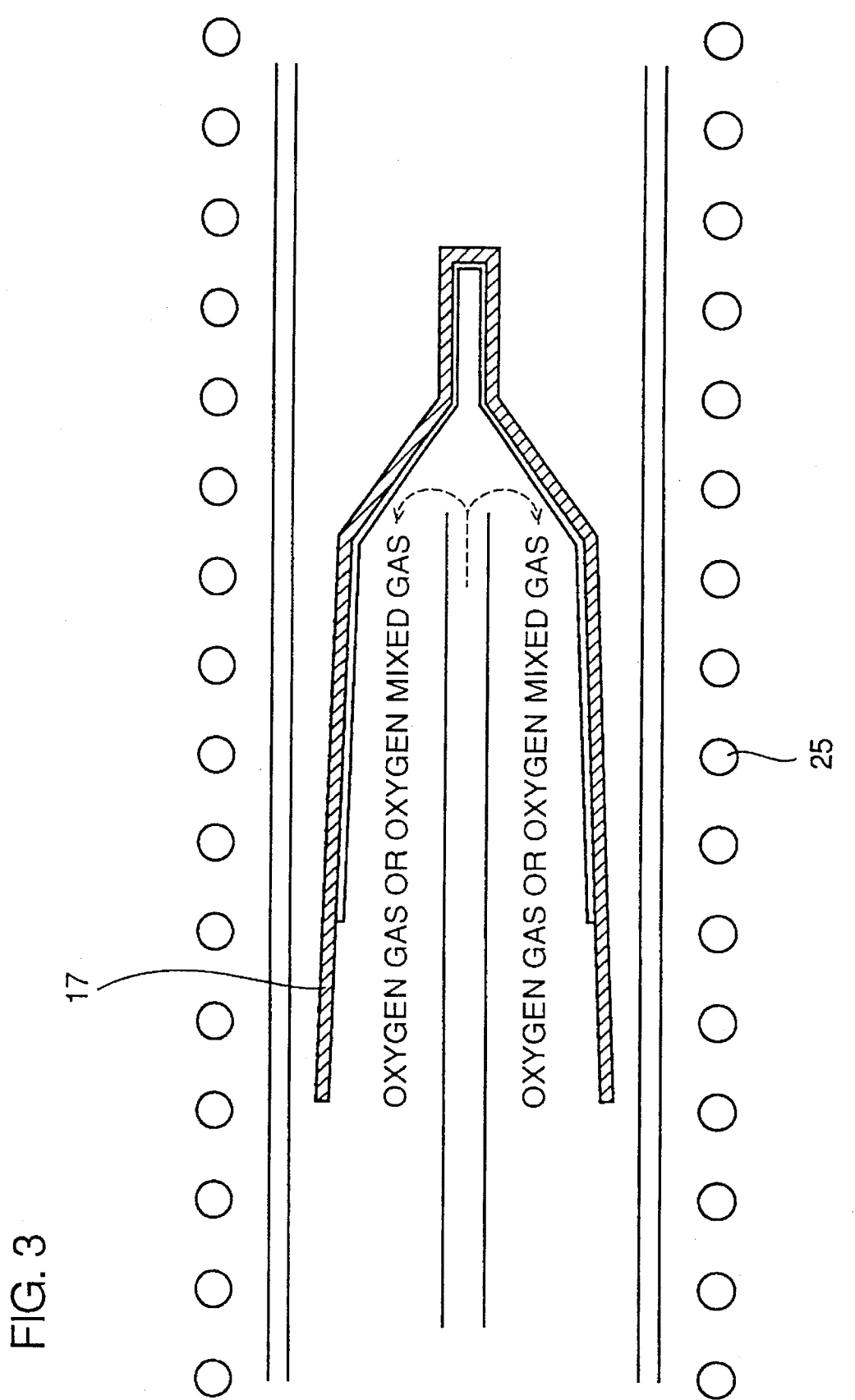
FIG. 3 is adapted to illustrate an exemplary situation of heat treating a boron or boron compound containing layer which is provided on an inner surface of a crucible.

FIG. 2 is an enlarge view showing a crucible 17 employed in the apparatus shown in FIG. 1, which is provided on its inner surface with a boron or boron compound containing film, and FIG. 3 is a diagram for illustrating an exemplary situation of heat treating the boron or boron compound containing layer which is formed on the inner surface of the crucible 17.

As shown in FIG. 2, the exemplary crucible 17 employed in the present invention has a seed crystal holding part 23 provided on its lower portion, and consists of a tapered part 22 and a side wall which are continuous thereto, while a boron or boron compound containing film 24 is formed at least on a wall surface which comes into contact with a raw material melt. The crucible 17 shown in FIG. 2 is introduced into an annular furnace 25 shown in FIG. 3 and heat treated with feeding of oxygen or oxygen-containing gas, so that a $B_2O_3$ containing film is formed on its inner surface.

Figure 4:
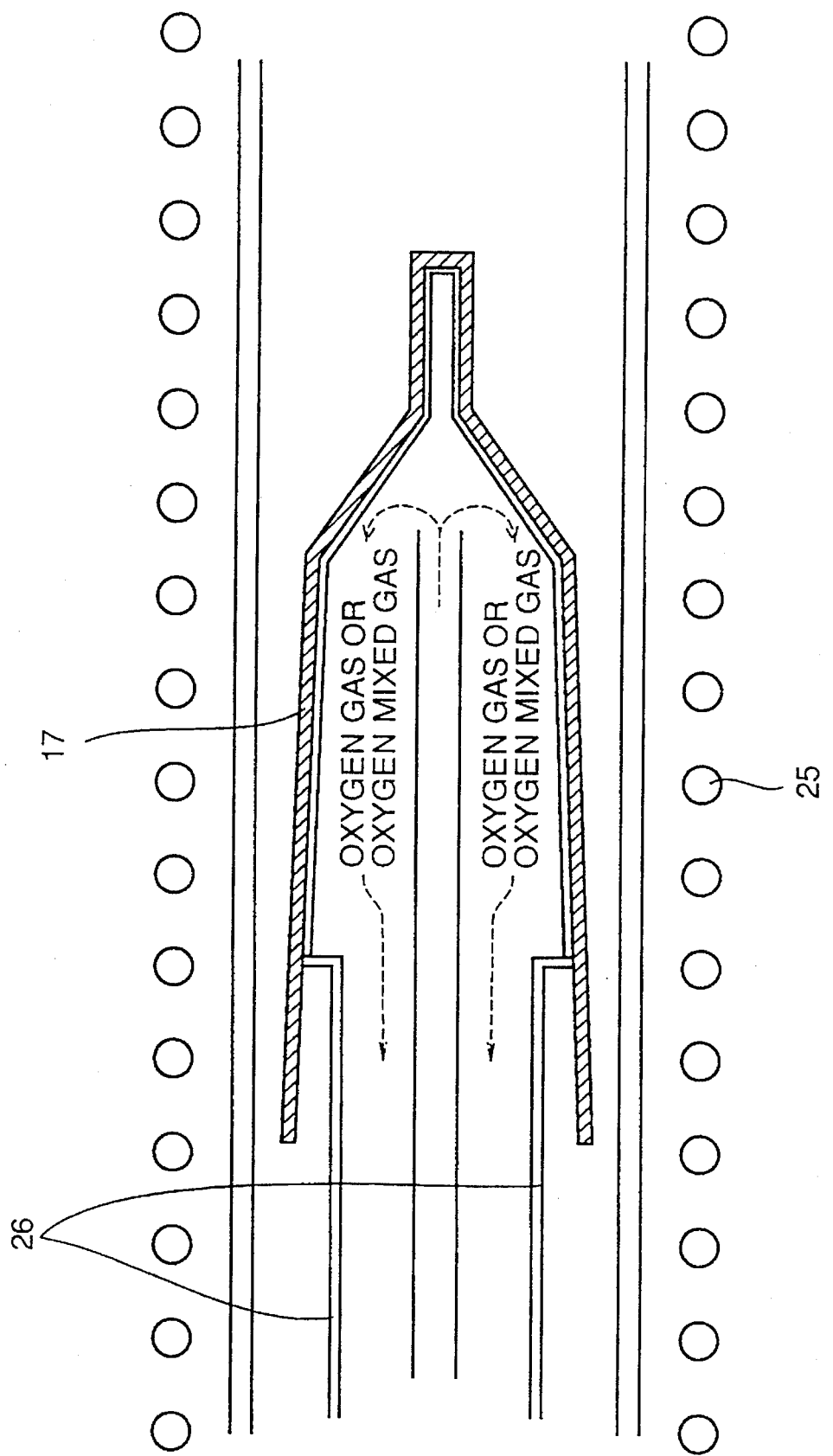
FIG. 4 is adapted to illustrate another exemplary situation of heat treating a boron or boron compound containing layer which is provided on an inner surface of a crucible.

FIG. 4 is a diagram for illustrating another exemplary situation of heat treating the boron or boron compound containing layer which is provided on the inner surface of the crucible 17. When the heat treatment is carried out in the annular furnace 25 shown in FIG. 3, an inner surface portion of the crucible 17 which is not provided with the $B_2O_3$ containing film is covered on its surface with a shielding material 26, for limiting the region to be provided with the film $B_2O_3$ containing film.

Description is now made on Examples which were carried out through such an apparatus for investigating the effects of the present invention.

EXAMPLE 1

As shown in FIG. 2, a PBN crucible of about 80 mm in diameter and about 300 mm in height having a tapered part and a seed crystal holding part on its lower portion was employed so that a boron nitride containing layer was formed on its surface by spraying, with employment of boron nitride powder, alcohol and carbon dioxide gas. Thereafter this crucible was introduced into an annular furnace, and was heat treated at 1000° C. for 5 hours with feeding of oxygen gas at a flow rate of 1 l /min., thereby forming a $B_2O_3$ film having a thickness of about 50 μm on its inner surface. Thereafter the crucible was cooled to the room temperature at a cooling rate of 10° C./min., with feeding of oxygen gas.

The water concentration of the $B_2O_3$ film obtained in the aforementioned manner was 0.02 percent by weight. Further, the thickness of this $B_2O_3$ film was extremely homogeneous, with dispersion of not more than ±5 μm.

Then, 3 kg of GaAs polycrystalline raw material and a dopant of solid Si were stored in the crucible which was provided with the $B_2O_3$ film on its inner surface, and the crucible was vacuum-sealed in a longitudinal quartz ampoule 14 having an arsenic pressure control part 15 as shown in FIG. 1. Then, the raw material which was stored in the crucible was melted, and thereafter the temperature was reduced from the seed crystal side while controlling the arsenic pressure in the ampoule 14, thereby growing Si-doped n-type GaAs single crystals.

Consequently, absolutely no polycrystallization caused by wetting was recognized in growth of 20 single crystals.

EXAMPLE 2

A solution which was prepared by dissolving orthoboric acid in methyl alcohol to attain saturation concentration was applied onto an inner surface of a PBN crucible having the same shape as that in Example 1, with an atomizer. Then, the methyl alcohol contained in the solution was quickly dried with dry nitrogen gas. The application and drying steps were repeated to form an orthoboric acid film having a thickness of about 100 μm. This crucible was introduced into an annular furnace, and was heat treated at 800° C. for about 2 hours with feeding of nitrogen gas at a flow rate of 1 l/min., thereby forming a $B_2O_3$ film having a thickness of about 50 μm on its inner surface. Then, the crucible was heated up to 1100° C. and held for 1 hour for adjusting the water concentration of the $B_2O_3$ film to 0.01 percent by weight, and thereafter cooled to the room temperature at a cooling rate of 10° C./min.

The thickness of the $B_2O_3$ film which was formed on the inner surface of the crucible obtained in the aforementioned manner was extremely homogeneous, with dispersion of not more than ±5 μm.

Then, this crucible was employed to grow Si-doped n-type GaAs single crystals, similarly to Example 1.

Consequently, absolutely no polycrystallization caused by wetting was recognized in growth of 20 single crystals.

EXAMPLE 3

$B_2O_3$ powder was charged in a PBN crucible having the same shape as that in Example 1 to be higher by 15 mm than a crystal as grown, and this crucible was introduced into a vertical heating furnace and heated to about 400° C., so that $B_2O_3$ adhered to its inner surface in a thickness of about 100 μm.

This crucible was introduced into a high-temperature heating furnace, and was heat treated at 1100° C. for 30 minutes with feeding of dry argon gas, thereby forming a $B_2O_3$ film having a thickness of 50±5 μm with water concentration which was adjusted to 0.01 percent by weight. Thereafter this crucible was cooled to the room temperature at a cooling rate of 5° C./min.

Then, this crucible was employed to grow Si-doped n-type GaAs single crystals, similarly to Example 1.

Consequently, absolutely no polycrystallization caused by wetting was recognized in growth of 20 single crystals.

EXAMPLE 4

A PBN crucible having the same shape as that in Example 1 was fixed into a deposition apparatus to downwardly direct its opening, and a boron nitride tablet of 20 m in diameter and 15 mm in thickness was set on a water-cooled holder. The deposition apparatus was evacuated and sealed, and the boron nitride tablet was thereafter irradiated with an electron beam so that a boron nitride film having a thickness of 60 μm adhered to the inner surface of the crucible. Thereafter the crucible was heat treated at 1000° C. for 10 hours with feeding of oxygen gas, thereby forming a $B_2O_3$ film having a thickness of 50±5 μm. Thereafter the crucible was cooled to the room temperature at a cooling rate of 10° C./min, with feeding of dry nitrogen gas.

The crucible obtained in the aforementioned manner was employed to grow Si-doped n-type GaAs single crystals, similarly to Example 1.

Consequently, absolutely no polycrystallization caused by wetting was recognized in growth of 20 single crystals.

EXAMPLE 5

A mixed solution of acetone and boron nitride powder was introduced into a PBN crucible having the same shape as that in Example 1 to form a high density boron nitride film having a thickness of about 25 μm on the inner surface of the crucible, and thereafter the residual mixed solution was discharged. Further, the same mixed solution of acetone and boron nitride powder was applied onto the high density boron nitride film with an atomizer, to form a low density boron nitride film having a thickness of about 50 μm. The crucible as obtained was heat treated in an annular furnace at 1000° C. for about 2 hours with feeding of mixed gas containing 50 percent of oxygen and 50 percent of argon at a flow rate of 1 l/min., thereby forming a $B_2O_3$ containing film having a thickness of about 50 μm.

The thickness of the $B_2O_3$ containing film as obtained was extremely homogeneous, with dispersion of ±5 μm. Further, the $B_2O_3$ content of the $B_2O_3$ containing film which was formed in the aforementioned manner was 80 percent by weight on the film surface, and 40 percent by weight in a portion which was in contact with the crucible.

Then, the crucible obtained in the aforementioned manner was employed to grow Si-doped n-type GaAs single crystals, similarly to Example 1.

Consequently, absolutely no polycrystallization caused by wetting was recognized in growth of 20 single crystals. Further, it was easy to remove the $B_2O_3$ containing film, whereby the life of the PBN crucible was substantially doubled, with small damage in removal of the film.

EXAMPLE 6

A solvent which was prepared by mixing boron nitride powder with powder of $SiO_2$ serving as a silicon oxide in the weight ratio of 1:3 ($BN:SiO_2=1:3$) and further mixing acetone into this mixture was applied to an inner surface of a PBN crucible having the same shape as that in Example 1 with an atomizer, to form a film containing boron nitrogen and $SiO_2$ having a thickness of about 40 μm. Further, another solution which was prepared by mixing boron nitride powder with powder of $SiO_2$ serving as a silicon oxide in the weight ratio of 3:2 ($BN:SiO_2=3:2$) and further mixing acetone to this mixture was applied onto this film with an atomizer, and the crucible was heat treated in an annular furnace at 1000° C. for 5 hours with feeding of oxygen gas at a flow rate of 1 l/min., thereby forming a $B_2O_3$ containing film having a thickness of about 50 μm.

The thickness of the film containing $B_2O_3$ as obtained was extremely homogeneous, with dispersion of not more than ±5 μm. Further, the $B_2O_3$ content of the $B_2O_3$ containing film which was formed in the aforementioned manner was 70 percent by weight on the film surface, and 30 percent by weight in a portion which was in contact with the crucible.

Then, the crucible obtained in the aforementioned manner was employed to grow Si-doped n-type GaAs single crystals, similarly to Example 1.

Consequently, absolutely no polycrystallization caused by wetting was recognized in growth of 20 single crystals. In addition, it was easy to remove the $B_2O_3$ containing film, whereby the life of the PBN crucible was substantially doubled, with small damage in removal of the film.

EXAMPLE 7

A solution which was prepared by mixing boron oxide powder with powder of $Al_2O_3$ in the weight ratio of 2:8 ($B_2O_3$:$Al_2O_3$=2:8) and further mixing acetone into this mixture was applied to an inner surface of a PBN crucible having the same shape as that in Example 1 with an atomizer, to form a film containing boron nitride and $Al_2O_3$ having a thickness of about 40 μm. Further, another solution which was prepared by mixing boron oxide powder with powder of $Al_2O_3$ in the weight ratio of 9:1 ($B_2O_3$:$Al_2O_3$= 9:1) and further mixing acetone to this mixture was applied onto this film with an atomizer, and the crucible was heat treated in an annular furnace at 1000° C. for 5 hours with feeding of oxygen gas at a flow rate of 1 l/min., thereby forming a $B_2O_3$ containing film having a thickness of about 50 μm.

The thickness of the film containing $B_2O_3$ as obtained was extremely homogeneous, with dispersion of not more than ±5 μ. Further, the $B_2O_3$ content of the $B_2O_3$ containing film which was formed in the aforementioned manner was 90 percent by weight on the film surface, and 20 percent by weight in a portion which was in contact with the crucible.

Then, the crucible obtained in the aforementioned manner was employed to grow Si-doped n-type GaAs single crystals, similarly to Example 1.

Consequently, absolutely no polycrystallization caused by wetting was recognized in growth of 20 single crystals. Further, it was easy to remove the $B_2O_3$ containing film, whereby the life of the PBN crucible was substantially doubled, with small damage in removal of the film.

Comparative Example 1

A PBN crucible having the same shape as that in Example 1 was heat treated in an annular furnace at 1100° C. for 50 hours with feeding of oxygen gas at a flow rate of 1 l/min., thereby forming a $B_2O_3$ film by oxidizing the inner surface of the crucible. While the average thickness of the $B_2O_3$ film as obtained was 50 μm, the thickness at a lower portion of the crucible was considerably large, with the maximum value of 200 μm. On the other hand, the thickness at an upper portion of the crucible was extremely small, with the value of substantially 0 μm. After formation of the $B_2O_3$ film, the crucible was not particularly held in a dry atmosphere, but cooled to the room temperature at a cooling rate of 2° C./min. Consequently, the water concentration of the $B_2O_3$ film was at an extremely high level of 1 percent by weight.

The crucible which was obtained in the aforementioned manner was employed to grow Si-doped n-type GaAs single crystals, similarly to Example 1.

Consequently, polycrystallization was caused by wetting on the upper portion of the crucible having the $B_2O_3$ film with a small thickness, in 16 samples among 20 single crystals as grown.

It is clearly understood from the above description that the following effects can be attained according to the present invention:

(1) The life of the crucible can be increased since the crucible itself is not oxidized.

(2) The boron or boron compound containing layer adhering to the inner surface of the crucible has a sparse structure, whereby the $B_2O_3$ containing film can be formed in a short time at relatively low temperature.

(3) The boron or boron compound containing layer adhering to the inner surface of the crucible has a sparse structure, whereby the oxidization inwardly progresses to facilitate formation of a thick $B_2O_3$ containing film.

(4) Formation of the $B_2O_3$ containing film is not influenced by the state of flow of the oxygen gas and it is not necessary to apply a high temperature for increasing its thickness, whereby a homogeneous film can be readily formed.

(5) When the $B_2O_3$ containing film is prepared from the oxygen-containing boron compound, it is possible to form the film in an extremely short time at a low temperature.

(6) It is possible to reduce damage of the crucible caused by strong adhesion of $B_2O_3$ and to increase its life by reducing $B_2O_3$ concentration in a portion of the $B_2O_3$ containing film which is in contact with the crucible.

(7) By decreasing the water concentration of the $B_2O_3$ containing film, $B_2O_3$ is less likely to scatter, whereby a homogenous film can be formed.

(8) It is possible to increase the life of the crucible and to form the $B_2O_3$ containing film in a short time at a low temperature, whereby the cost can be reduced.

(9) The compound semiconductor crystal can be grown in the crucible comprising a homogenous $B_2O_3$ containing film, whereby a high single crystal yield can be attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a compound semiconductor crystal, comprising in order the following steps:

(a) applying a boron containing layer that contains boron or an oxygen-free boron compound onto at least a selected area of an inner surface of a crucible, wherein said layer has an interface surface contacting said inner surface of said crucible and a free exposed surface opposite said interface surface;

(b) heat treating said crucible while at least a portion of said free exposed surface is under an oxygen containing atmosphere, so as to oxidize at least a portion of said boron or said oxygen-free boron compound to provide boron oxide and form a boron oxide containing layer at least at said free exposed surface of said boron containing layer;

(c) charging a raw material into said crucible;

(d) melting said raw material to form a melt; and (e) solidifying said melt from an end of said crucible, thereby growing said crystal.

2. The method of claim 1, wherein said heat treating step is carried out at a temperature in the range of 700° C. to 1800° C.

3. The method of claim 1, wherein said boron containing layer has a first density internally therein and a second density at said free exposed surface, and wherein said first density is greater than said second density.

4. The method of claim 1, wherein said boron containing layer further contains at least one substance selected from the group consisting of a group III element, a group IV element, a group V element, a compound of said group III element, a compound of said group IV element, and a compound of said group V element.

5. The method of claim 4, wherein said substance is Ga, Al, a Ga compound or an Al compound.

6. The method of claim 4, wherein said boron containing layer has a gradient of said at least one substance with a greater substance content at said interface surface and a smaller substance content at said free exposed surface.

7. The method of claim 1, wherein said boron containing layer further contains Si or an Si compound.

8. The method of claim 1, wherein said boron oxide containing layer is formed only at an area of said crucible that is to be in contact with said melt in said steps (d) and (e).

9. The method of claim 1, wherein said boron containing layer is an oxygen-free boron compound containing layer.

10. The method of claim 1, wherein said inner surface of said crucible is not oxidized to form boron oxide in said step (b).

11. The method of claim 1, wherein said steps (a) and (b) are carried out so that said boron oxide containing layer has a gradient of boron oxide content with a greater boron oxide content at said free exposed surface that is greater than 50 percent by weight and with a smaller boron oxide content at said interface surface that is less than 50 percent by weight.

12. The method of claim 1, wherein said steps (a) and (b) are carried out so that said boron oxide containing layer has a gradient of boron oxide content with a greater boron oxide content at said free exposed surface that is at least about 70 percent by weight and with a smaller boron oxide content at said interface surface that is not more than about 40 percent by weight.

13. The method of claim 1, wherein said steps (a) and (b) are carried out so that a boron oxide content at said interface surface is about zero.

14. The method of claim 1, wherein said heat treating step is carried out at a temperature not more than about 1000° C.

15. The method of claim 1, further comprising cooling said crucible in a reduced pressure or dry gas atmosphere after said step (b) so that said boron oxide containing layer contains not more than 0.5 percent by weight of water after said cooling.

16. The method of claim 1, further comprising cooling said crucible in a reduced pressure or dry gas atmosphere after said step (b) so that said boron oxide containing layer contains in the range from 0.001 to 0.1 percent by weight of water after said cooling.

17. The method of claim 1, wherein said heat treating step is carried out at a first temperature for a first period of time, and further comprising a second heat treating step at a second temperature for a second period of time, wherein said second temperature is higher than said first temperature and said second period of time is shorter than said first period of time.

18. The method of claim 1, wherein said heat treating step is carried out at a temperature sufficient to at least soften said boron containing layer and improve adhesion of said boron containing layer onto said inner surface of said crucible.

19. The method of claim 1, wherein said steps (a) and (b) are carried out to form said boron oxide containing layer as a substantially continuous and homogenous film.

20. The method of claim 1, wherein said steps (a) and (b) are carried out to form said boron oxide containing layer with a thickness of at least about 50 μm with a nonuniformity not greater than ±5 μm.

21. The method of claim 1, wherein said step (a) comprises sputtering or vacuum deposition of a boron containing material.

22. The method of claim 1, wherein said step (a) comprises applying a plurality of films by at least two different methods to form said boron containing layer.

23. The method of claim 1, wherein said step (a) comprises applying a plurality of films having at least two different compositions to form said boron containing layer.

24. The method of claim 1, wherein essentially all of said boron or said oxygen-free boron compound of said boron containing layer is oxidized in said step (b).

25. The method of claim 1, wherein only a portion of said boron or said oxygen-free boron compound of said boron containing layer is oxidized in said step (b) to leave some unoxidized boron or oxygen-free boron compound remaining.

26. The method of claim 25, wherein said unoxidized boron or oxygen-free boron compound is dispersed through said boron containing layer.

27. A method of preparing a compound semiconductor crystal, comprising in order the following steps:

(a) applying an oxygen-containing boron compound containing layer onto at least a selected area of an inner surface of a crucible, wherein said layer has an interface surface contacting said inner surface of said crucible and a free exposed surface opposite said interface surface;

(b) heat treating said crucible so as to form a boron oxide containing layer at least at said free exposed surface of said boron compound containing layer;

(c) charging a raw material into said crucible;

(d) melting said raw material to form a melt; and (e) solidifying said melt from an end of said crucible, thereby growing said crystal.

28. The method of claim 27, wherein said heat treating step is carried out at a temperature in the range of 300° C. to 1800° C.

29. The method of claim 28, further comprising a second heat treating step of heating said crucible to a temperature in the range of 1000° C. to 1800° C. after said heat treating step (b), so that said boron oxide containing layer contains not more than 0.5 percent by weight of water after said second heat treating step.

30. The method of claim 29, wherein said second heat treating step is carried out so that said boron oxide containing layer contains in the range from 0.001 to 0.1 percent by weight of water after said second heat treating step.

31. The method of claim 27, wherein said boron compound containing layer has a first density internally therein and a second density at said free exposed surface, and wherein said first density is greater than said second density.

32. The method of claim 27, wherein said boron compound containing layer further contains at least one substance selected from the group consisting of a group III element, a group IV element, a group V element, a compound of said group III element, a compound of said group IV element, and a compound of said group V element.

33. The method of claim 32, wherein said substance is Ga, Al, a Ga compound or an Al compound.

34. The method of claim 27, wherein said boron compound containing layer further contains Si or an Si compound.

35. The method of claim 27, wherein said boron oxide containing layer is formed only at an area of said crucible that is to be in contact with said melt in said steps (d) and (e).

36. The method of claim 27, wherein said steps (a) and (b) are carried out to form a gradient of boron oxide content with a greater boron oxide content at said free exposed surface and a smaller boron oxide content at said interface surface.

37. The method of claim 36, wherein said steps (a) and (b) are carried out so that said greater boron oxide content at said free exposed surface is greater than 50 percent by weight, and said smaller boron oxide content at said interface surface is less than 50 percent by weight.

38. The method of claim 36, wherein said steps (a) and (b) are carried out so that said greater boron oxide content at said free exposed surface is at least about 70 percent by weight, and said smaller boron oxide content at said interface surface is not more than about 40 percent by weight.

39. The method of claim 36, wherein said steps (a) and (b) are carried out so that said smaller boron oxide content at said interface surface is about zero.

40. The method of claim 36, wherein said boron compound containing layer further contains at least one substance selected from the group consisting of elements and compounds of elements of groups III, IV and V of the periodic table, and wherein said steps (a) and (b) are further carried out to form a gradient of content of said at least one substance with a greater substance content at said interface surface and a smaller substance content at said free exposed surface.

41. The method of claim 27, wherein said heat treating step is carried out at a temperature in the range of 400° C. to about 1000° C.

42. The method of claim 27, wherein said steps (a) and (b) are carried out to form said boron oxide containing layer as a substantially continuous and homogenous film.

43. The method of claim 27, wherein said steps (a) and (b) are carried out to form said boron oxide containing layer with a thickness of at least about 50 μm with a nonuniformity not greater than ±5 μm.

44. The method of claim 27, wherein said step (a) comprises applying a plurality of films by at least two different methods to form said boron compound containing layer.

45. The method of claim 27, wherein said step (a) comprises applying a plurality of films having at least two different compositions to form said boron compound containing layer.

* * * * *

UNITED STATES PATENT AND TRADEMARK OFFICE
CERTIFICATE OF CORRECTION

PATENT NO. : 5,584,929
DATED       : Dec. 17, 1996
INVENTOR(S) : Kawase

It is certified that error appears in the above-identified patent and that said Letters Patent is hereby corrected as shown below.

Title Page: In [54] line 1, after "PREPARING" insert --A--;
          In [56] References Cited,
              replace "5,131,975  7/1992  Bournet-Courchesne" by
              --5,131,975  7/1992  Bourret-Courchesne--;
     In [57] ABSTRACT
            line 5, replace "the" by --then--.
Col. 1, line 2, after "PREPARING" insert --A--;
       line 26, replace "being" by --it is--;
       line 28, delete "melt and the", after "wall" insert --by the melt--;
       line 30, replace "portions of" by --areas where--, replace "and" by --wets--;
       line 32, after "been" insert --generally--, replace "in" by --.--;
       line 33, delete "general:";
       line 35, delete "In relation to a boat or a crucible";
       line 36, replace "of quartz, it" by --It--, after "known" insert --to be--,
           replace "its" by --the--; after "wettability" insert --of a quartz boat or crucible--;
       line 37, delete "In relation to a";
       line 38, replace "crucible of PBN, on" by --On--, after "known" insert to be--;
       line 39, after "wetting" insert --of a PBN crucible--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 1, line 41, after "material" insert --for the melt--;
       line 46, delete "which is", replace "its" by --the--;
       line 47, after "surface" insert --of the chamber 1--, delete "which are"; replace "its" by --the--, after "interior" insert --of the chamber 1--;
       line 48, delete "," (first occurrence), delete "13, which";
       line 49, replace "is mounted on its center." by --13 arranged in the center of the chamber 1.--;
       line 55, replace "manner:" by --manner.--;
       line 59, replace "so that" by --and--;
       line 61, after "charged" insert --into the crucible 17--, replace "which is arranged in the" by --.--;
       line 62, delete "crucible 17.--;
       line 63, after "$B_2O_3$" insert --20--;
       line 66, before "temperature" insert --the--;
       line 67, replace "so that" by --whereupon--, replace "downwardly" by --moved downwardly--.
Col. 2, line 1, delete "moved--;
       line 2, replace "and the" by --whereby the melted--;
       line 7, replace "left intact and" by --fixed, i.e. maintained unchanged, and instead the--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 2, line 9, replace "portion" by --zone--, after "the" insert --melted--, replace "which is stored" by --held--;
line 16, replace "formed" by --embodied--;
line 20, after "material" insert --19--;
line 21, after "and" insert --the--, after "$B_2O_3$" insert --material 20--;
line 22, after "sealed" insert --and heated--, after "softened" insert --and flows--;
line 26, replace "Further, each of" by --Furthermore,--;
line 28, replace "proposes method of" by --each propose a method that involves--;
line 30, after "same" insert --,--, delete "previously", replace "coat" by --coating--;
line 32, replace "same" by --boat or crucible--;
line 34, replace "and hence" by --whereby--;
line 37, before "with" insert --into the crucible together--, delete the paragraph spacing between lines 37 and 38;
line 39, replace ":" by --.--;
line 40, replace "First," by --On the one hand,--;
line 42, replace "problems:" by --problems.--;
line 47, after "as" insert --it is--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

line 53, replace "to break" by --which thereby disrupts--;
        line 54, replace "expose" by --exposes--;
        line 59, delete "and";
        line 60, replace "oxidizing the same for previously forming" by --to oxidize the boat or crucible and form--;
        line 61, replace "of the boat or the crucible" by --thereof--;
        line 62, replace ":" by --.--;
        line 66, after "film" insert --by oxidizing the crucible itself--.
Col. 3, line 1, replace "a" by --the--;
        line 2, after "crucible" insert --,--, delete "(pyrolytic boron nitride)";
        line 3, after "structure" insert --,--;
        line 8, replace ", and" by --. Moreover, the viscosity of the--, delete "in viscosity";
        line 9, replace "and collected" by --, whereby the $B_2O_3$ tends to collect--;
        line 19, delete "of a raw material melt with respect to", replace "and" by --by a raw material melt and thus--;
        line 21, replace "in" by --with--;
        line 22, replace "According to an" by --One--, replace "invention," by --invention provides--;
        line 23, replace "is provided." by --.--;

UNITED STATES PATENT AND TRADEMARK OFFICE
CERTIFICATE OF CORRECTION

Page 5 of 19

PATENT NO. : 5,584,929
DATED : Dec. 17, 1996
INVENTOR(S) : Kawase

It is certified that error appears in the above-identified patent and that said Letters Patent is hereby corrected as shown below.

line 27, replace "replace "is" by --has been--;
       line 28, after "an" insert --oxygen-containing atmosphere, e.g. an--;
       line 29, after "atmosphere" insert --,--;
       line 31, after "layer," insert --then--, replace "in" by --into--;
       line 32, replace "is" by --has been--;
       line 33, delete "charged";
       line 38, after "gas," insert --an additional--;
       line 39, replace "prepared from that hardly reacting" by --a gas that hardly reacts--;
       line 40, replace "having" by --has a--;
       line 65, replace "in" by --into--, replace "so that" by --and thereafter--.
Col. 4, line 4, replace "except" by --at areas other than--;
       line 5, after "grown" insert --in the crucible will be--;
       line 6, replace "adheres" by --adhered--;
       line 12, replace "limitedly" by --to be limited only--;
       line 14, replace "According to another" by --Another--, replace "invention, a" by --invention provides another--;
       line 15, replace "is" by --.--;
       line 16, delete "provided.";
       line 19, replace "is" by --has been--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

line 22, after "charging" insert --a--, replace "in" by --into--, replace "is" by --has been--;
    line 23, delete "charged";
    line 24, replace "for forming" by --to form--;
    line 41, replace "In order to form the" by --The--;
    line 42, after "layer" insert --may be formed--, delete ",";
    line 43, replace "employed is a method of" by --by--;
    line 47, after "the" (first occurrence) insert --resulting--, delete "as formed";
    line 50, replace "in" by --into--;
    line 51, replace "so that the" by --and thereafter the residual--, delete "the" (second occurrence), delete "there";
    line 52, delete "after";
    line 60, after "addition," insert --a--;
    line 61, replace "in" by --into--, replace "so that" by --and then--;
    line 66, replace "which" by --that--.
Col. 5, line 8, replace "portion, which" by --portion of the layer that--; replace ", of the boron" by --.--;
    line 9, delete "oxide containing layer formed by the heat treatment.";
    line 11, replace "to damage" by --which damages--;
    line 13, replace "since" by --because--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 5, line 15, replace "which" by --of the layer that--;
line 16, replace "damage on" by --adhesion of the layer onto the crucible and reduce the resulting damage of--;
line 17, delete "to";
line 18, replace "which" by --of the layer that--;
line 24, please cancel the entire line;
line 25, replace "described," by --Moreover, it should be understood that--;
line 26, replace "which" by --of the layer that--, delete "in the boron";
line 27, delete "oxide containing layer formed by the heat treatment";
line 28, replace "with that on the surface, so that" by --to the portion of the layer forming the exposed surface facing the melt. In other words, a boron oxide concentration gradient or a plurality of layers with different oxide concentrations are provided, as explained below. In this manner--;
line 30, after "and" insert --simultaneously--;
line 35, delete "also";
line 36, replace "oxidization," by --oxidation, this can also be achieved by introducing--;
line 37, delete "may be";
line 38, delete "introduced";

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 5, line 40, replace "oxidization" by --oxidation--;
       line 41, delete "layer having", after "density" insert --layer--;
       line 42, after "portion" insert --of the layer--;
       line 43, replace "that" by --the portion of the layer--;
       line 47, delete "which is";
       line 48, delete "a com-";
       line 49, cancel the entire line;
       line 50, replace "element and a compound of the group V element to" by --and respective compounds thereof, into--;
       line 52, delete "prepared from";
       line 54, delete "prepared from";
       line 56, replace "is" by --can--, replace "prepared" by --be--;
       line 57, delete "from", replace "is" by --can--;
       line 58, replace "prepared from" by --be--;
       line 60, delete "prepared from";
       line 62, delete "prepared from";
       line 66, after "reducing" insert --the--, after "of" insert --the--.
Col. 6, line 1, after ",", insert --the--, replace "compound and" by --compound, or the--;
       line 3, replace "which" by --that--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 6, line 4, after "crucible" insert --,--;
      line 5, after "layer" insert --,--, after "and" insert --correspondingly--;
      line 8, after "preferably" insert --to--, after "portion" insert --of the crucible--;
      line 9, after "is" insert --to be--;
      line 11, delete "the" (third occurrence);
      line 12 after "a" insert --reduced--, delete "reduction";
      line 15, delete "the" (first occurrence), after "the" (second occurrence) insert --reduced--;
      line 16, delete "reduction";
      line 21, replace "under" by --at--;
      line 22, replace "to damage" by --, which thereby damages the--;
      line 27, after "from" insert --absorbing--, delete "absorption";
      line 28, delete "the" (second occurrence);
      line 31, replace "the" by --a--;
      line 32, replace ", while" by --. However,--;
      line 34, replace "since" by --, because at high temperatures--, replace "flows" by --will flow--;
      line 41, after "such" insert --a two-step--;
      line 42, after "film" insert --with a low water content--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 6, line 46, replace "so far" by --as long--;
        line 49, after "either" insert --,--;
        line 50, replace "so far" by --as long--;
        line 52, after "Further," insert --the--;
        line 54, replace "so far as the same" by --as long as it--;
        line 56, replace "According to still" by --Still--, replace "invention," by --invention provides--;
        line 58, delete "is provided";
        line 60, replace "the same is provided" by --it has--, delete "with";
        line 61, after "having" insert --a--;
        line 63, after "weight," insert --and--;
        line 66, delete "prepared from";
Col. 7, line 7, after "itself" insert --,--, after "but" insert --rather--;
        line 9, replace "thereby forming" by --so as to form--;
        line 11, after "ducing" insert --a--;
        line 12, delete "previously";
        line 13, after "crucible" insert --prior to charging the raw material,--, replace "preventing" by --assuring that--;
        line 14, replace "from" by --does not form an--.

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 7, line 16, delete "with", replace "remove" by --prevent--, replace "for" by --of--;
line 21, after "in" insert --an--, after "gas" insert --atmosphere--;
line 22, replace "along a" by --according to the following--;
line 23, delete "in the following";
line 29, delete "inevitably", after "necessary" insert --in the treatment atmosphere,--;
line 30, delete "also";
line 32, replace "along a" by --according to the following--;
line 33, delete "in the following";
line 36, replace "to" by --of the powder onto--;
line 37, after "applying" insert --a--;
line 38, replace "which is" by --that has been--;
line 40, replace "stored" by --charged into or held--;
line 43, after "that" insert --the--;
line 46, replace "stored" by --charged into or held--;
line 58, replace "a" by --the--;
line 61, replace "is adapted to illustrate" by --illustrates--;
line 63, replace "which is" by --that has been--.

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 7, line 64, replace "which is" by --that has been--;
      line 65, replace "is adapted to illustrate" by --illustrates--;
      line 67, replace "which is" by --that has been--.
Col. 8, line 4, before "DESCRIPTION" insert --DETAILED--, delete "THE", after "PREFERRED" insert --EXAMPLE--;
      line 5, after "EMBODIMENTS" insert --AND OF THE BEST MODE OF THE INVENTION--;
      line 10, after "Fig. 5" insert --,--;
      line 11, replace "employment of" by --the apparatus of Fig. 1 uses--, replace "which is" by --that has been--;
      line 12, replace ", and" by --. Thus,--;
      line 13, delete "hence", after "description" insert --of Fig. 5 that also applies to Fig. 1--;
      line 20, replace "enlarge" by --enlarged--, before "employed" insert --that is--;
      line 21, replace ", which is" by --. The crucible 17 has been--;
      line 23, replace "diagram for" by --schematic drawing--;
      line 25, replace "which is" by --that has been--;
      line 29, replace "provided on" by --at--, replace "portion" by --end--;

UNITED STATES PATENT AND TRADEMARK OFFICE
CERTIFICATE OF CORRECTION

Page 13 of 19

PATENT NO. : 5,584,929
DATED : Dec. 17, 1996
INVENTOR(S) : Kawase

It is certified that error appears in the above-identified patent and that said Letters Patent is hereby corrected as shown below.

Col. 8, line 30, delete "a" (second occurrence), replace "wall which are" by --walls--;
line 31, replace "is" by --has been--, after "formed" insert --on--;

line 32, delete "on", replace "which comes" by --that will come--, replace "a" by --the--;
line 33, after "melt" insert --21--;
line 35, replace "with" by --while--, delete "of", replace "that" by --as to form--;
line 36, delete "is formed";
line 37, delete "for";
line 39, replace "is" by --has been--;
line 41, replace "Fig. 3," by --Fig. 4,--;
line 42, replace "which" by --that--, after "not" insert --to be--;
line 43, replace "on its surface" by --or shielded from the oxygen containing gas--;
line 45, delete "film" (first occurrence);
line 46, replace "Description is now made on Examples" by --Several Examples--;

UNITED STATES PATENT AND TRADEMARK OFFICE
CERTIFICATE OF CORRECTION

Page 14 of 19

PATENT NO. : 5,584,929
DATED : Dec. 17, 1996
INVENTOR(S) : Kawase

It is certified that error appears in the above-identified patent and that said Letters Patent is hereby corrected as shown below.

Col. 8, line 47, replace "through" by --using--, after "apparatus" insert --will now be described--;
       line 53, delete "of";
       line 54, after "height" insert --, and--;
       line 55, replace "portion" by --end,--;
       line 56, replace "employed so that a" by --employed. A--;
       line 57, replace "its" by --the crucibles inner--, delete ",", delete "employment of";
       line 60, delete "with";
       line 61, replace "feeding of" by --while feeding--;
       line 63, delete "the";
       line 64, replace "with" by --while--;
       line 65, delete "of";
Col. 9, line 2, after "with" insert --a--;
       line 4, replace "stored in" by --placed into--, after "crucible" insert --,--, replace "was" by --had been--;
       line 8, delete "which was stored";
       line 10, after "reduced" insert --starting--;
       line 13, replace "Consequently," by --As a result,--;
       line 14, after "in" insert --the--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 9, line 18, delete "which";
line 19, after "concentration" insert --and--, after "was" insert --then--;
line 20, after "applied" insert --, using an atomizer,--;
line 21, replace ", with an atomizer" by --.--;
line 27, replace "with" by --while--, delete "of" (first occurrence);
line 32, delete "the";
line 34, replace "which" by --that--;
line 35, delete "obtained";
line 36, after "with" insert --a--;
line 40, replace "Consequently," by --As a result,--;
line 41, after "in" insert --the--;
line 45, replace "in" by --into--;
line 46, replace "to be higher by" by --. The crucible was filled with the powder to a level or height that was--, after "mm" insert --higher--;
line 47, replace "as" by --to be--, replace ", and" by --subsequently in the crucible. Then,--;
line 49, replace "in" by --as a layer with--;
line 51, replace "This" by --Then, the--;
line 53, replace "with" by --while--, delete "of";
line 54, replace "with" by --, and a--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 9, line 55, delete "which was";
      line 56, delete "the";
      line 60, replace "Consequently," by --As a result,--;
      line 61, after "in" insert --the--;
      line 66, replace "to downwardly direct" by --with--;
      line 67, after "opening" insert --directed downwardly--, delete "of".
Col.10, line 2, replace "evacuated and sealed" by --sealed and evacuated--;
      line 4, replace "so that" by --to deposit--;
      line 5, replace "adhered to" by --adhering onto--;
      line 6, replace "with" by --while--;
      line 7, delete "of";
      line 9, delete "the", replace "with" by --while--, delete "of";
      line 10, delete "of";
      line 14, replace "Consequently," by --As a result,--;
      line 15, after "in" insert --the--;
      line 29, replace "with" by --while--, replace "of" (first occurrence) by --a--;
      line 34, after "with" insert --a--;
      line 42, replace "Consequently," by --As a result,--;
      line 43, after "in" insert --the--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 10, line 46, replace "small damage in removal of" by --only minimal damage being caused by removing--;
    line 50, replace "solvent which" by --solution--;
    line 51, delete "powder of", before "serving" insert --powder--, after "a" insert --source of--;
    line 52, after "1:3)" insert --,--;
    line 53, replace "mixture was" by --powder mixture. The solution was then--;
    line 55, replace "nitrogen" by --nitride--;
    line 56, before "having" insert --, and--;
    line 57, delete "which";
    line 58, delete "powder of", before "serving" insert --powder--, after "a" insert --source of--;
    line 60, replace "to" by --into--, after "this" insert --powder--, after "mixture" insert --. This second solution--, replace "this" by --the previously formed first--;
    line 62, replace "with" by --while--, delete "of";
    line 66, after "with" insert --a--.
Col. 11, line 3, replace "which" by --that--;
    line 7, replace "Consequently," by --As a result,--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 11, line 8, after "in" insert --the--;
      line 11, replace "small" by --only minimal--, replace "in removal of" by --being caused by removing--;
      line 15, delete "which";
      line 16, delete "powder of", before "in" insert --powder--;
      line 17, after "this" insert --powder--;
      line 18, after "mixture" insert --. This solution--;
      line 22, delete "which";
      line 23, delete "powder of", before "in" insert --powder--;
      line 24, replace "to this" by --into this powder--, after "mixture" insert --. This second solution--;
      line 25, replace "this" by --the previously formed first--;
      line 26, replace "with" by --while--;
      line 27, delete "of" (first occurrence);
      line 31, after "with" insert --a--;
      line 35, replace "which" by --that--;
      line 39, replace "Consequently," by --As a result,--;
      line 40, after "in" insert --the--;
      line 43, replace "small" by --only minimal--, replace "in removal of" by --being caused by removing--;

UNITED STATES PATENT AND TRADEMARK OFFICE
CERTIFICATE OF CORRECTION

PATENT NO. : 5,584,929
DATED : Dec. 17, 1996
INVENTOR(S) : Kawase

It is certified that error appears in the above-identified patent and that said Letters Patent is hereby corrected as shown below.

Col. 11, line 49, replace "with" by --while--, delete "of" (first occurrence);
        line 53, replace "large" by --greater--;
        line 58, delete "the";
        line 59, replace "Consequently," by --As a result,--;
        line 61, replace "which" by --that--;
        line 64, replace "Consequently," by --As a result, it was observed that--;
        line 65, after "the" (third occurrence) insert --relatively thin--;
        line 66, delete "with a small thickness";
        line 67, replace "as" by --that were--;
Col. 12, line 9, after "at" insert --a--;
        line 12, replace "inwardly progresses" by --progresses inwardly--;
        line 13, after "facilitate" insert --the--;
        line 16, replace "its" by --the film's--;
        line 24, replace "its" by --the crucible's--;
        line 25, after "reducing" insert --the--;
        line 26, replace "which" by --that--.

Signed and Sealed this

Twelfth Day of August, 1997

*Attest:*

*Attesting Officer*

BRUCE LEHMAN

*Commissioner of Patents and Trademarks*